(12) United States Patent
Wang et al.

(10) Patent No.: US 6,258,626 B1
(45) Date of Patent: Jul. 10, 2001

(54) METHOD OF MAKING STACKED CHIP PACKAGE

(75) Inventors: Hsueh-Te Wang, Kaohsiung Hsien; Su Tao, Kaohsiung, both of (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/610,858

(22) Filed: Jul. 6, 2000

(51) Int. Cl.[7] ............................ H01L 21/44; H01L 21/48; H01L 21/50
(52) U.S. Cl. ........................ 438/107; 438/109; 257/777
(58) Field of Search ...................... 257/777; 438/107, 438/108, 109, 118

(56) References Cited

U.S. PATENT DOCUMENTS

| | | | |
|---|---|---|---|
| 5,422,435 | * 6/1995 | Takiar et al. | 174/52.4 |
| 5,923,090 | * 7/1999 | Fallon et al. | 257/777 |
| 5,973,403 | 10/1999 | Wark | 257/777 |
| 6,098,278 | * 8/2000 | Vindasius et al. | 29/830 |
| 6,191,483 | * 2/2001 | Loo | 257/737 |

OTHER PUBLICATIONS

Dufresne et al., "Hybrid assembly technology for flip-chip-on-chip (FCOC) PBGA laminate assembly", Proc. 50th Electronic Components & Tech. Conf., May 2000, 541–548.*

Baliga, "Packaging Provides Viable Alternative to SOC", Semiconductor International, Jul. 2000, http://www.semiconductor.net/semiconductor/issues/2000/200007/six0007soc.asp.*

* cited by examiner

Primary Examiner—Vu A. Le
Assistant Examiner—Christian D. Wilson
(74) Attorney, Agent, or Firm—Reed Smith Hazel & Thomas LLP

(57) ABSTRACT

A method of making a stacked chip package comprises the steps of: (a) placing a first chip onto a substrate in a manner that solder bumps on the first chip are aligned with corresponding flip-chip pads formed on a surface of the substrate; (b) reflowing the solder bumps; (c) attaching a second chip to the first chip through an adhesive layer; (d) curing the adhesive layer; (e) forming an underfill between the first chip and the substrate; (f) curing the underfill; (g) electrically coupling the second chip to corresponding wire-bondable pads formed on the surface of the substrate; and (h) encapsulating the first chip and the second chip against a portion of the surface of the substrate. This invention is characterized in that the adhesive layer is cured before underfilling thereby forming a protection layer on the first chip. Therefore, the cured adhesive layer can help the first chip to resist stresses created during curing process of the underfill, thereby reducing the problem of die cracking.

16 Claims, 3 Drawing Sheets

METHOD OF MAKING STACKED CHIP PACKAGE

BACKGROUND OF THE INVENTION

1. Field of the Invention

This invention relates to a method of making a stacked chip package, and more specifically to a method of packaging semiconductor chips on a substrate in a stacking arrangement.

2. Description of the Related Art

U.S. Pat. No. 5,973,403, issued Oct. 26, 1999, discloses a conventional stacked chip package 100 (see FIG. 1) comprising a first semiconductor chip being flip-chip bonded to a substrate 120, and a second semiconductor chip being back-side attached to the first chip 110 and then wire-bonded to the substrate 120. The upper surface of the substrate 120 is provided with a plurality of wire-bondable pads 122 and a plurality of flip-chip pads 124. The lower surface of the substrate 120 is provided with a plurality of solder pads 126. The first chip 110 is attached to the flip-chip pads 124 of the substrate 120 through a plurality of solder joints 112. The second chip 130 is connected to the wire-bondable pads 122 on the substrate 120 through a plurality of bonding wires 132. Typically, an underfill 114 is formed between the chip 110 and the substrate 120 for sealing the gap between the solder joints 112. The second chip 130 is attached onto the backside surface of the first chip 110 through an adhesive layer 134. Typically, the adhesive layer 134 is made of thermosetting epoxy material.

Referring to FIG. 2, in mass production of the stacked chip package 100, it is desirable to integrally form a plurality of substrates in a substrate strip having alignment holes (not shown) so that the packaging process can be automated. Normally, the semiconductor chip is formed of microcrystalline silicon with a coefficient of thermal expansion (CTE) of 3–5 ppm° C.$^{-1}$. The substrate strip is usually formed of polymer impregnated fiberglass having a coefficient of thermal expansion of 25–40 ppm° C.$^{-1}$ and the thickness of the substrate strip is less than 0.36 mm. Since there is a significant difference between the semiconductor chip 110 and the substrate strip in CTE and the substrate strip is rather thin, the semiconductor chip 110 and the substrate strip expand and contract in different amounts along with temperature fluctuations during the curing process of the underfill 114 thereby causing the semiconductor chip 110 and the substrate strip to warp. The curing process of the underfill 114 typically comprises 30 minutes of precure at 120° C. and three hours of postcure at 150° C. The higher curing temperature and longer curing time are employed, the greater warpage the semiconductor chip 110 and the substrate strip will produce. As the underfill 114 cures and shrinks, a bending moment can be applied to the chip 110, since it is securely attached to the substrate strip. This bending moment, if severe enough, can fracture the chip 110.

Referring to FIG. 2, the warped substrate strip and semiconductor chip 110 will result in adverse influences on the chip 110 itself and the subsequent manufacturing process. For example, the warped substrate strip and semiconductor chip 110 may bring about positioning errors during dispensing the adhesive layer 134, such that the epoxy adhesive can not be dispensed in precise amounts and to correct positions on the chip 110. This may cause the bonding layer on the chip 110 formed from the epoxy adhesive to have incomplete filling problem thereby adversely affecting the bonding quality between the chip 110 and chip 130.

Curing temperature of the underfill 114 and the adhesive layer 134 depends on the materials used in the underfill 114 and the adhesive layer 134; typically, it is higher than the maximum exothermic temperature of the underfill 114 and the adhesive layer 134. The maximum exothermic temperature of the underfill 114 and the adhesive layer 134 can be calculated from the heat of cure curve for the underfill 114 and the adhesive layer 134 detected by Differential Scanning Calorimeter (DSC).

U.S. Pat. No. 5,973,403 also discloses a method of making the stacked chip package 100. However, this method does not teach how to overcome the warpage problems described above. The present invention therefore seeks to provide a method of making the stacked chip package that overcomes, or at least reduces the above-mentioned problems of the prior art.

SUMMARY OF THE INVENTION

It is an object of the present invention to provide a method of making a stacked chip package wherein the curing process and materials of adhesive layers are optimized to minimize the warpage of the substrate strip and the lower chip before mounting of the upper chip.

The method of making a stacked chip package according to a first preferred embodiment of the present invention comprises the steps of: (a) providing a first chip having a plurality of solder bumps on the active surface thereof and placing the first chip onto a substrate in a manner that solder bumps of the first chip are aligned with corresponding flip-chip pads formed on a surface of the substrate; (b) reflowing the solder bumps so as to mechanically and electrically attach the first chip to the substrate; (c) attaching a second chip to the first chip through an adhesive layer with the backside surface of the second chip facing the backside surface of the first chip; (d) curing the adhesive layer; (e) forming an underfill between the first chip and the substrate; (f) curing the underfill; (g) electrically coupling the second chip to corresponding wire-bondable pads formed on the surface of the substrate; and (h) encapsulating the first chip and the second chip against a portion of the surface of the substrate. It is noted that the adhesive layer is cured in step (d) before underfilling such that the adhesive layer can act as a protection layer on the backside surface of the first chip during curing of the underfill. Therefore, the cured adhesive layer can help the first chip to resist stresses created during curing process of the underfill, thereby reducing the problem of die cracking.

The method of making a stacked chip package according to a second preferred embodiment of the present invention comprises the steps of: (a') placing the first chip onto a substrate in a manner that solder bumps of the first chip are aligned with corresponding flip-chip pads formed on a surface of the substrate; (b') reflowing the solder bumps so as to mechanically and electrically attach the first chip to the substrate; (c') forming an underfill between the first chip and the substrate; (d') partially curing the underfill such that it gels but does not harden; (e') attaching the second chip to the first chip through an adhesive layer; (f') curing the adhesive layer and the underfill between the first chip and the substrate; (g') electrically coupling the second chip to the wire-bondable pads; and (h') encapsulating the first chip and the second chip against a portion of the upper surface of the substrate. During the step (d'), the underfill is heated to a temperature at which it gels but does not harden (the gelling temperature and time are material dependent). Thus, the heating temperature and time for the first chip and the substrate are reduced such that the first chip and the substrate dose not experience much thermal stress during the step (d'). Therefore, the resulting warpage of the first chip and the substrate is minimized thereby assuring the proceeding of subsequent processes such as the dispensing of the adhesive layer during step (e').

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 3:
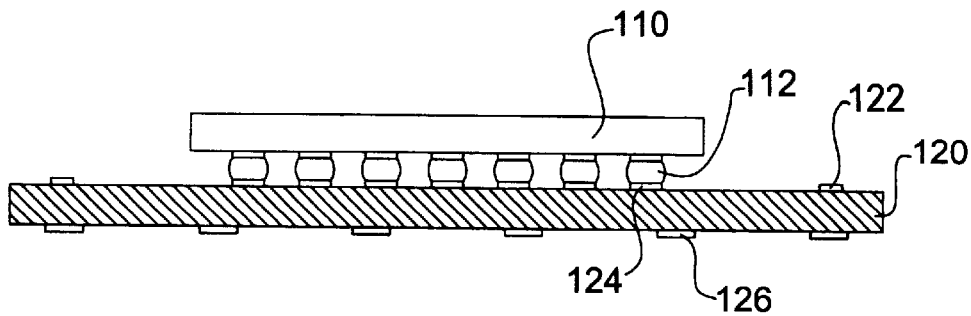
FIGS. 3–5 illustrating a method of making the stacked chip package according to a first preferred embodiment of the present invention.
Figure 4:
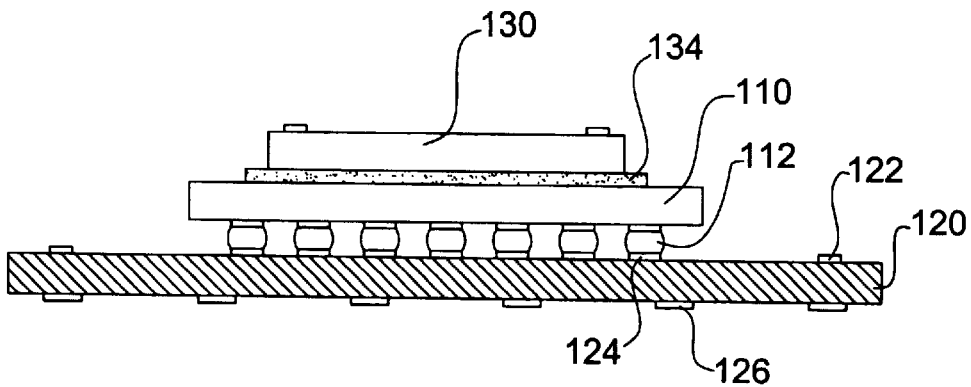
Figure 5:
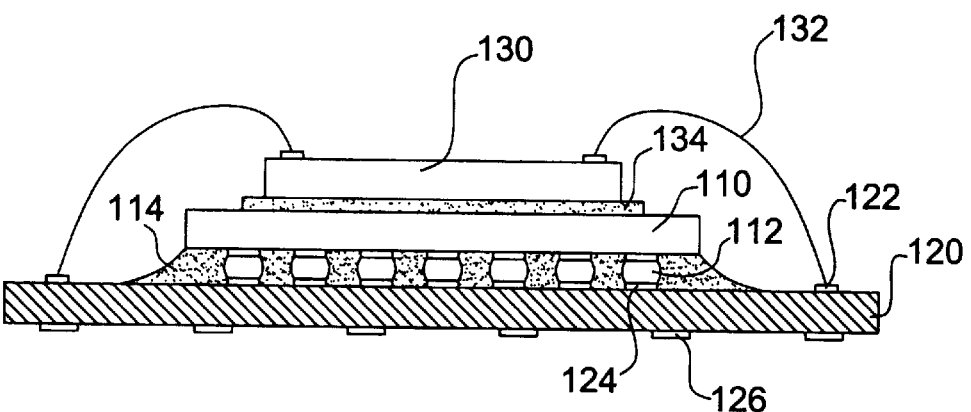

FIGS. 3–5 illustrates a method of making a stacked chip package according to a first preferred embodiment of the present invention.

FIG. 3 shows a chip 110 attached onto a substrate 120 through a plurality of solder joints 112. Preferably, the substrate 120 is formed from polyimide film or fiberglass reinforced BT (bismaleimide-triazine) resin. Usually, the thickness of the substrate 120 is less than 0.36 mm. The upper surface of the substrate 120 is provided with a plurality of flip-chip pads 124 and a plurality of wire-bondable pads 122 arranged about the periphery of the flip-chip pads 124. The flip-chip pads 124 and wire-bondable pads 122 are electrically connected to solder pads 126 formed on the lower surface of the substrate 120 through conductive traces and vias (not shown).

The chip 110 is transferred to the dip fluxer by an automatic pick and place machine and then solder bumps previously formed on the chip 110 are dipped into a controlled layer of flux in the dip fluxer. Once fluxed, the chip 110 is lifted from the volume of flux and is accurately placed on the substrate 20 in a manner that the solder bumps of the chip 110 are accurately aligned with corresponding flip-chip pads 124 of the substrate 120. Typically, the dip fluxer is located inside the chip placement machine and comprises a flat rotating platen to prepare a controlled layer of flux. The solder bumps can be formed on the chip 110 by a conventional C4 (Controlled Collapse Chip Connection) process comprising the steps of: (a) forming an under bump metallurgy (UBM) on bonding pads of the chip 110, and (b) forming solder bumps on the UBM.

Then, the chip 110 and the substrate 120 are transferred to a reflow oven, and then a plurality of solder joints 112 are formed through the reflowing process. The solder joints 12 are used to mechanically and electrically attach the chip 110 to the substrate 120.

FIG. 4 shows a chip 130 attached onto the backside surface of the chip 110 through an adhesive layer 134. The adhesive layer 134 is applied onto the backside surface of the chip 110 by dispensing, and then the chip 130 is attached by conventional automatic chip-attach operation. Preferably, the adhesive layer 134 is capable of substantially completely curing in less than 10 minutes at a temperature in the range of about 125° C. up to about 150° C.

Referring to FIG. 5, underfill material is laid down along the edge surface of the chip 110 by using an automated underfill dispense system. Then, the underfill material is pulled under the chip 110 by capillary action. Thereafter, the assembly as shown in FIG. 5 is placed into an underfill-curing oven to cure the underfill 114.

In this embodiment of the present invention, the underfill 114 is formed and cured after dispensing the adhesive layer 134. Therefore, before dispensing the adhesive layer, warpage of the chip 110 and the substrate 120 due to heating in the curing process can be avoided so as to assure the proceeding of the dispensing process. Further, since the adhesive layer 134 is cured before underfilling such that the adhesive layer can act as a protection layer on the backside surface of the chip 110 during curing of the underfill. In other words, the cured adhesive layer 134 can help the chip 110 to resist stresses created during curing process of the underfill 114, thereby reducing the problem of die cracking.

Referring to FIG. 5, the bonding wires 132 are connected to the bonding pads on the chip 130 and the wire-bondable pads 122 on the upper surface of the substrate 120 using conventional wire bonding techniques.

Figure 1:
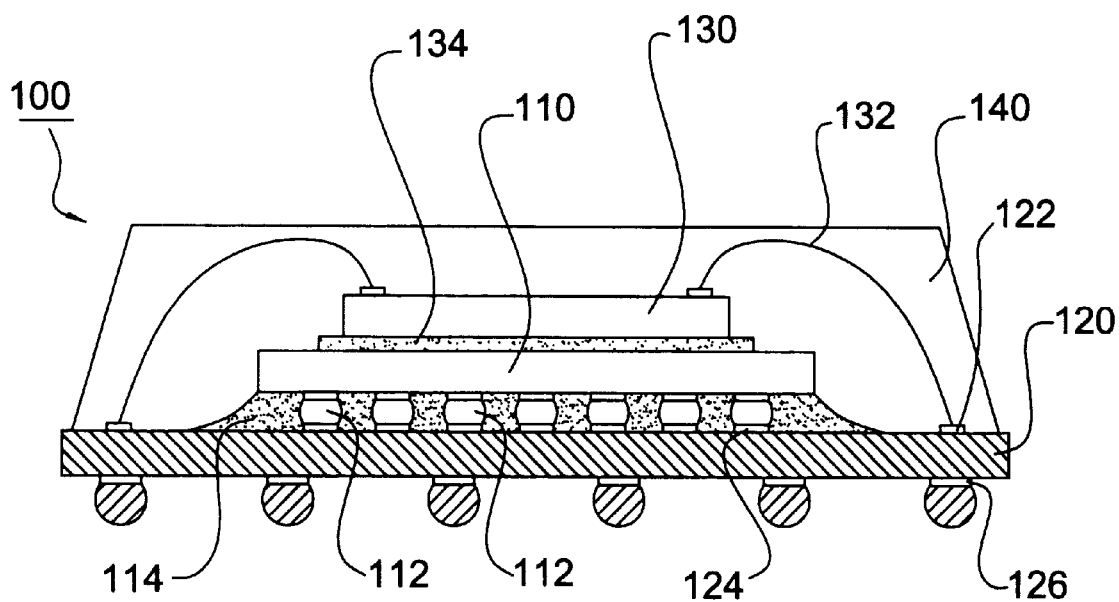
FIG. 1 is a cross-sectional view of a stacked chip package disclosed in U.S. Pat. No. 5,973,403.
Figure 2:
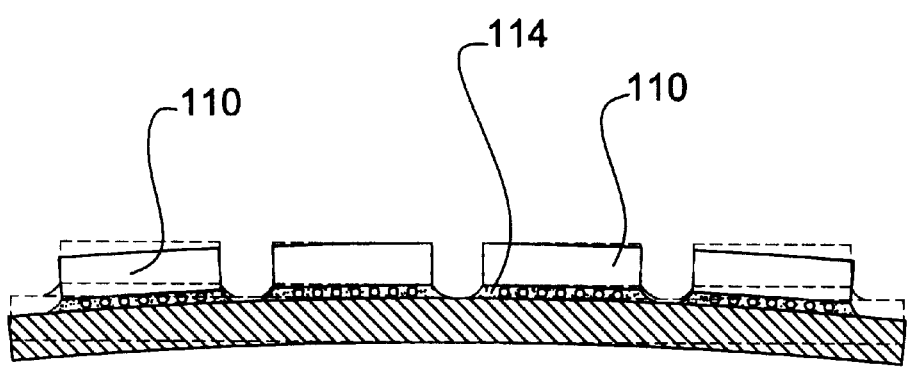
FIG. 2 shows warped substrate and chip after curing the underfill formed therebetween.

Thereafter, a package body 140 is formed over the semiconductor chip 110, 130 and a portion of the upper surface of the substrate 120 using known plastic molding methods such as transfer molding. Finally, a plurality of solder balls (not shown) are mounted to the solder pads on the lower surface of the substrate 120 so as to obtain the stacked chip package 100 of FIG. 1.

Figure 6:
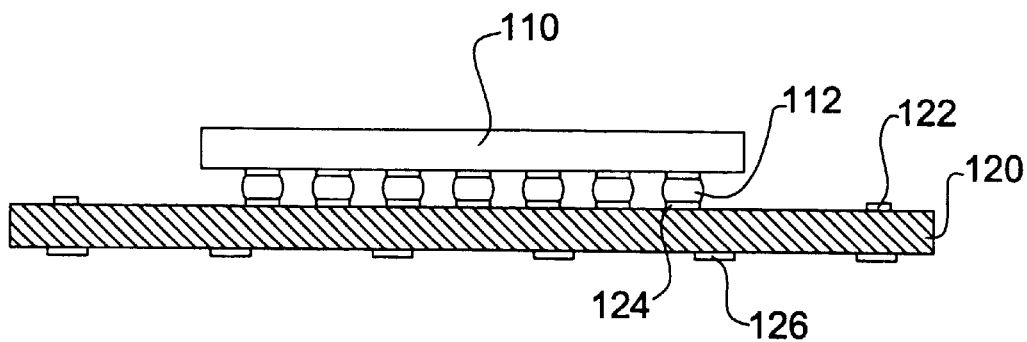
FIGS. 6–8 illustrating another method of making the stacked chip package according to a second preferred embodiment of the present invention.
Figure 7:
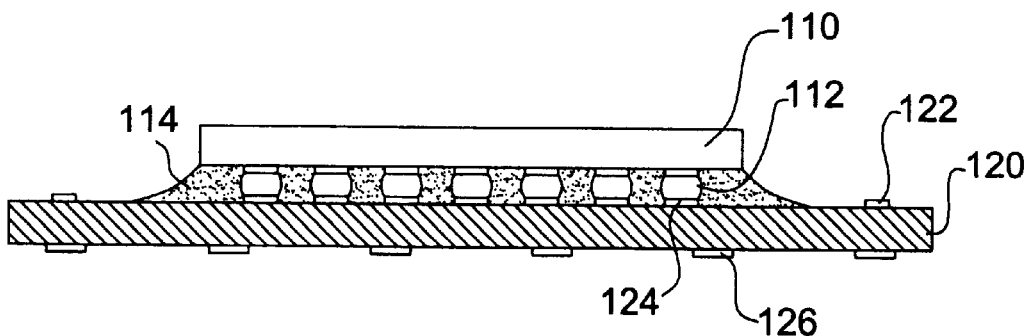
Figure 8:
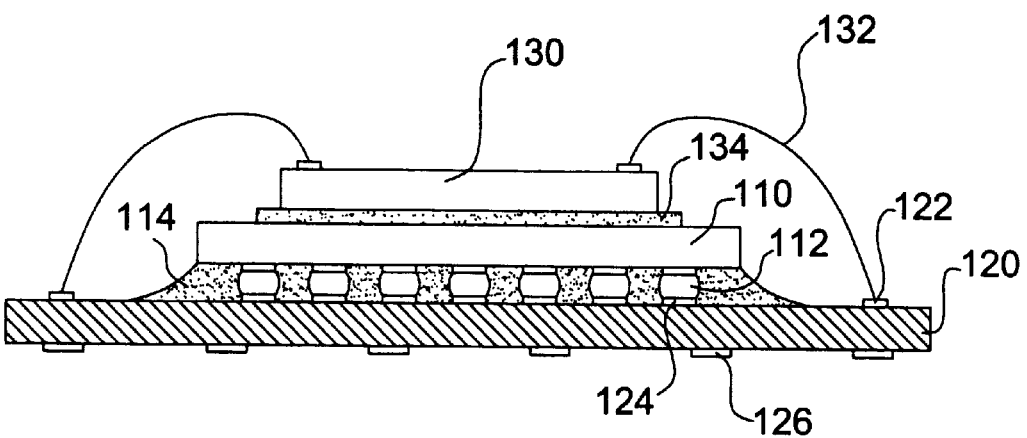

FIGS. 6–8 illustrates a method of making a stacked chip package according to a second preferred embodiment of the present invention.

FIG. 6 shows a chip 110 attached onto a substrate 120 through a plurality of solder joints 112 wherein the details process steps are the same as those described above.

Referring to FIG. 7, after the underfill 114 is formed between the chip 110 and the substrate 120, the underfill 114 is partially cured, i.e., the underfill 114 is heated to a temperature at which it gels but does not harden. The partial curing process can be accomplished by placing the assembly as shown in FIG. 7 in an oven, or blowing hot air on the underfill 114, and heating to the appropriate temperature. The gelling time and temperature is determined by the amount of time required so that there is minimum warpage induced on the chip 110 and the substrate 120 and at the same time the underfill 114 can be gelled to assure the proceeding of subsequent processes. In this embodiment of the present invention, "gel" is intended to mean the point at which the liquid underfll becomes a solid, i.e., the point at which the underfill material develops a measurable elastic modulus.

FIG. 8 shows a chip 130 attached onto the backside surface of the chip 110 through an adhesive layer 134. Since the underfill 114 is heated to a temperature at which it gels but does not harden during the previous process, the heating temperature and time for the chip 110 and the substrate 120 are significantly reduced as compared with conventional methods. Thus, the resulting warpage of the chip 110 and the substrate 120 is minimized whereby the adhesive material can be precisely dispensed to the predetermined positions on the chip 110.

Then, the adhesive layer 134 and the underfill 114 are completely cured. When materials of the adhesive layer 134 and the underfill 114 are chosen such that the maximum exothermic temperature of the adhesive layer 134 is about the same as that of the underfill 114, the adhesive layer 134 and the underfill 114 may be cured simultaneously. Preferably, the adhesive layer 134 is capable of substantially completely curing in less than 10 minutes at a temperature in the range of about 125° C. up to about 150° C.

Alternatively, it is preferable to choose proper materials to form the adhesive layer 134 and the underfill 114 such that the maximum exothermic temperature of the adhesive layer 134 is lower than that of the underfill 114. A suitable adhesive layer having a lower maximum exothermic temperature is QMI536 commercially available from QUANTUM MATERIALS, INC. This makes the adhesive layer 134 can be cured at a lower temperature. In this embodiment, it is desired to completely cure the adhesive layer 134 first. Then, the underfill 114 is completely cured after the adhesive layer 134 is cooled to form a protection layer on the chip 110. Therefore, during the curing process of the underfill 114, the cured adhesive layer 134 can help the chip 110 to resist stresses created in the curing process, thereby reducing the problem of die cracking.

The details of subsequent processes such as wire bonding process, encapsulating process, and ball mounting process are the same as those described above. In this embodiment of the present invention, since the adhesive layer 114 is heated to a temperature at which it gels but does not harden, the heating temperature for the chip 110 and the substrate 120 are significantly reduced as compared with conventional methods. Thus, the chip 110 and the substrate 120 dose not experience much stress during the partial curing process thereby minimizing the resulting warpage of the chip 110 and the substrate 120 so as to assure the proceeding of subsequent processes. Besides, since the adhesive layers 134 and the underfill 114 may be cured simultaneously, the cycle time for the assembly process illustrated in this embodiment is reduced thereby cutting down the production cost.

Although the invention has been explained in relation to its preferred embodiment, it is to be understood that many other possible modifications and variations can be made without departing from the spirit and scope of the invention as hereinafter claimed.

What is claimed is:

1. A method of making a stacked chip package comprising the steps of:

providing a substrate having opposing upper and lower surfaces, the upper surface of the substrate being provided with a plurality of flip-chip pads and a plurality of wire-bondable pads arranged about the periphery of the flip-chip pads;

providing a first chip having a plurality of solder bumps on the active surface thereof;

placing the first chip onto the substrate in a manner that the solder bumps of the first chip are aligned with the flip-chip pads of the substrate;

reflowing the solder bumps so as to mechanically and electrically attach the first chip to the substrate;

providing a second chip having a plurality of bonding pads formed on the active surface thereof;

attaching the second chip to the first chip through an adhesive layer;

curing the adhesive layer;

forming an underfill between the first chip and the substrate;

curing the underfill;

electrically coupling the second chip to the wire-bondable pads; and encapsulating the first chip and the second chip against a portion of the upper surface of the substrate.

2. The method as claimed in claim 1, wherein the substrate further comprises a plurality of solder pads on the lower surface of the substrate wherein the solder pads are electrically connected to the flip-chip pads and the wire-bondable pads, respectively.

3. The method as claimed in claim 2, further comprising the step of respectively mounting solder balls onto the solder pads.

4. The method as claimed in claim 1, wherein the adhesive layer is capable of substantially completely curing in less than 10 minutes at a temperature in the range of about 125° C. up to about 150° C.

5. The method as claimed in claim 1, wherein the substrate is formed from polyimide film or fiberglass reinforced BT (bismaleimide-triazine) resin.

6. The method as claimed in claim 5, wherein the substrate has a thickness less than about 0.36 Mm.

7. A method of making a stacked chip package comprising the steps of:

providing a substrate having opposing upper and lower surfaces, the upper surface of the substrate being provided with a plurality of flip-chip pads and a plurality of wire-bondable pads arranged about the periphery of the flip-chip pads;

providing a first chip having a plurality of solder bumps on the active surface thereof;

placing the first chip onto the substrate in a manner that the solder bumps of the first chip are aligned with the flip-chip pads of the substrate;

reflowing the solder bumps so as to mechanically and electrically attach the first chip to the substrate;

forming an underfill between the first chip and the substrate;

partially curing the underfill such that it gels but does not harden;

providing a second chip having a plurality of bonding pads formed on the active surface thereof;

attaching the second chip to the first chip through an adhesive layer;

curing the adhesive layer and the underfill between the first chip and the substrate;

electrically coupling the second chip to the wire-bondable pads; and encapsulating the first chip and the second chip against a portion of the upper surface of the substrate.

8. The method as claimed in claim 7, wherein the substrate further comprises a plurality of solder pads on the lower surface of the substrate wherein the solder pads are electrically connected to the flip-chip pads and the wire-bondable pads, respectively.

9. The method as claimed in claim 8, further comprising the step of respectively mounting solder balls onto the solder pads.

10. The method as claimed in claim 7, wherein the adhesive layer is capable of substantially completely curing in less than 10 minutes at a temperature in the range of about 125° C. up to about 150° C.

11. The method as claimed in claim 7, wherein the substrate is formed from polyimide film or fiberglass reinforced BT (bismaleimide-triazine) resin.

12. The method as claimed in claim 7, wherein the substrate has a thickness less than about 0.36 mm.

13. The method as claimed in claim 7, wherein the maximum exothermic temperature of the adhesive layer is substantially the same as that of the underfill.

14. The method as claimed in claim 13, wherein the step of curing the adhesive layer and the underfill comprises curing the adhesive layer and the underfill simultaneously.

15. The method as claimed in claim 7, wherein the maximum exothermic temperature of the adhesive layer is lower than that of the underfill.

16. The method as claimed in claim 15, wherein the step of curing the adhesive layer and the underfill comprises curing the adhesive layer and then curing the underfill.

* * * * *